(12) United States Patent
Hara

(10) Patent No.: US 6,278,635 B1
(45) Date of Patent: Aug. 21, 2001

(54) STORAGE METHOD OF SEMICONDUCTOR STORAGE APPARATUS

(75) Inventor: Hideki Hara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/726,981

(22) Filed: Nov. 30, 2000

(30) Foreign Application Priority Data

Dec. 3, 1999 (JP) ................................. 11-344873

(51) Int. Cl.$^7$ ................................. G11C 16/04
(52) U.S. Cl. ................. 365/185.3; 365/185.29; 365/185.27; 365/185.18; 365/185.13; 365/185.11; 365/185.02
(58) Field of Search .................. 365/185.3, 185.33, 365/185.29, 185.27, 185.24, 185.22, 185.18, 185.11, 185.13, 185.02

(56) References Cited

U.S. PATENT DOCUMENTS 5,668,759 * 9/1997 Ohtsuki ........................ 365/185.29
5,856,944 * 1/1999 Prickett, Jr. et al. ........... 365/185.29
6,006,304 * 12/1999 Mukai et al. .................. 711/103

* cited by examiner

Primary Examiner—Andrew Q. Tran

(57) ABSTRACT

There is provided a storage method of a semiconductor storage apparatus provided with a source/drain area formed in a semiconductor substrate, a floating gate formed on a top layer of the area via a gate insulating film, and a control gate formed on the floating gate via an interlayer insulating film, the method comprising steps of: applying a predetermined positive voltage to a bit line connected to the drain area and a word line connected to the control gate, injecting an electron to the floating gate, and writing data to a selected memory cell; applying a predetermined negative voltage to a gate line, applying the predetermined positive voltage to a common source line connected to the semiconductor substrate or the source area, discharging the electron accumulated in the floating gate of the selected memory cell, and performing data erasing; and after the data erasing, applying the predetermined positive voltage necessary for injecting the electron to the floating gate from a channel area in the vicinity of the source area to the common source line, and performing write-back of the memory cell erased excessively.

4 Claims, 5 Drawing Sheets

|  | WRITING | ERASING | COMPACTION (WRITE-BACK) | READING |
|---|---|---|---|---|
| SELECTED BIT LINE (DRAIN) | 5V | HZ | GND | 1V |
| NON-SELECTED BIT LINE (DRAIN) | GND | HZ | 5V | GND |
| SELECTED WORD LINE (GATE) | 10V | -10V | 5V | 3V |
| NON-SELECTED WORD LINE (GATE) | GND | GND | GND | GND |
| COMMON SOURCE LINE | GND | GND(or 5V) | 5V | GND |
| SUBSTRATE (P WELL) | GND | 5V(or GND) | GND | GND |

|  | WRITING | ERASING | COMPACTION (WRITE-BACK) | READING |
|---|---|---|---|---|
| SELECTED BIT LINE (DRAIN) | 5V | HZ | GND | 1V |
| NON-SELECTED BIT LINE (DRAIN) | GND | HZ | 5V | GND |
| SELECTED WORD LINE (GATE) | 10V | -10V | 5V | 3V |
| NON-SELECTED WORD LINE (GATE) | GND | GND | GND | GND |
| COMMON SOURCE LINE | GND | GND(or 5V) | 5V | GND |
| SUBSTRATE (P WELL) | GND | 5V(or GND) | GND | GND |

FIG. 2

|  | WRITING | ERASING | COMPACTION (WRITE-BACK) | READING |
|---|---|---|---|---|
| SELECTED BIT LINE (DRAIN) | 5V | HZ | GND | 1V |
| NON-SELECTED BIT LINE (DRAIN) | GND | HZ | GND | GND |
| SELECTED WORD LINE (GATE) | 10V | -10V | 5V | 3V |
| NON-SELECTED WORD LINE (GATE) | GND | GND | GND | GND |
| COMMON SOURCE LINE | GND | GND(or 5V) | 5V | GND |
| SUBSTRATE (P WELL) | GND | 5V(or GND) | GND | GND |

FIG. 3

|  | WRITING | ERASING | COMPACTION (WRITE-BACK) | READING |
|---|---|---|---|---|
| SELECTED BIT LINE (DRAIN) | 5V | HZ | GND | 1V |
| NON-SELECTED BIT LINE (DRAIN) | GND | HZ | GND | GND |
| SELECTED WORD LINE (GATE) | 10V | -10V | 5V | 3V |
| NON-SELECTED WORD LINE (GATE) | GND | GND | 5V | GND |
| COMMON SOURCE LINE | GND | GND(or 5V) | 5V | GND |
| SUBSTRATE (P WELL) | GND | 5V(or GND) | GND | GND |

FIG. 4

|  | WRITING | ERASING | COMPACTION (WRITE-BACK) | READING |
|---|---|---|---|---|
| SELECTED BIT LINE (DRAIN) | 5V | HZ | 5V | 1V |
| NON-SELECTED BIT LINE (DRAIN) | GND | HZ | GND | GND |
| SELECTED WORD LINE (GATE) | 10V | -10V | 5V | 3V |
| NON-SELECTED WORD LINE (GATE) | GND | GND | GND | GND |
| COMMON SOURCE LINE | GND | GND(or 5V) | GND | GND |
| SUBSTRATE (P WELL) | GND | 5V(or GND) | 5V(or GND) | GND |

STORAGE METHOD OF SEMICONDUCTOR STORAGE APPARATUS

BACKGROUND OF THE INVENTION

1. Field of the Invention

The present invention relates to a step-down circuit, particularly to a circuit for decreasing an external power source voltage supplied from the outside, and the present invention also relates to a semiconductor storage apparatus and a storage method, particularly to a semiconductor storage apparatus and a storage method for performing an operation of erasing data stored in the semiconductor storage apparatus and subsequently writing back a cell in an excessively erased state.

The present invention further relates to a storage method of a semiconductor storage apparatus, particularly to a storage method of a semiconductor storage apparatus for performing an operation of erasing data stored in the semiconductor storage apparatus and subsequently writing back the cell in the excessively erased state.

2. Description of the Prior Art

In order to achieve a low voltage operation in a flash memory, it is necessary to reduce a cell threshold value voltage after erasing, and various studies have been performed.

As a conventional data writing operation of the flash memory, there is known a channel hot electron (CHE) injection system comprising: applying a voltage of about 5 V to a selected bit line connected to a selected cell drain diffusion layer; applying a voltage of about 10 V as a high voltage to a selected word line connected to a selected cell control gate; and injecting an electron generated in a channel area (P well surface layer area between source and drain) in the vicinity of the drain diffusion layer into a floating gate (FG).

Moreover, with respect to data erasing, the erasing is performed (FN tunneling system) by applying a voltage of about 5 V to a substrate (or a source diffusion layer), applying a negative high voltage to all word lines or a selected word line (control gate), and extracting an electron accumulated in FG to the substrate (or the source diffusion layer).

After the erasing operation, by applying a voltage of about 5 V to the drain diffusion layer, applying a voltage of about 5 V to the control gate, injecting the electron to FG with respect to a cell in a depression state (excessively erased state), and performing a light writeback operation (compaction), a threshold value distribution of the cell in the excessively erased state is converged, and this operation is well known, and described, for example, in Japanese Patent Application No. 116660/1993. The aforementioned cell writing, erasing, and write-back operations are shown in FIG. 5.

When the compaction operation is performed in the aforementioned method, by repeatedly performing the operation, a gate insulating film in the vicinity of a drain side is loaded with a stress by electron injection in the compaction operation in addition to electron injection in the writing operation, the gate insulating film is easily deteriorated, and a problem occurs that the semiconductor storage apparatus lacks reliability.

SUMMARY OF THE INVENTION

1. Objects of the Invention

An object of the present invention is to provide a storage method of a semiconductor storage apparatus which can prevent deterioration of a gate insulating film by repeatedly performing data writing/erasing.

2. Summary of the Invention

There is provided a storage method of a semiconductor storage apparatus provided with a source/drain area formed in a semiconductor substrate, a floating gate formed on a top layer of the area via a gate insulating film, and a control gate formed on the floating gate via an interlayer insulating film, the method comprising steps of: applying a predetermined positive voltage to a bit line connected to the drain area and a word line connected to the control gate, injecting an electron to the floating gate, and writing data to a selected memory cell; applying a predetermined negative voltage to a gate line, applying the predetermined positive voltage to a common source line connected to the semiconductor substrate or the source area, discharging the electron accumulated in the floating gate of the selected memory cell, and performing data erasing; and after the data erasing, applying the predetermined positive voltage necessary for injecting the electron to the floating gate from a channel area in the vicinity of the source area to the common source line, and writing back the memory cell erased excessively.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 2 is a chart showing a first embodiment of the present invention;

FIG. 3 is a chart showing a second embodiment of the present invention;

FIG. 4 is a chart showing a third embodiment of the present invention; and

FIG. 5 is a chart showing a related art.

DETAILED DESCRIPTION OF THE PREFERRED EMBODIMENTS

Figure 1:
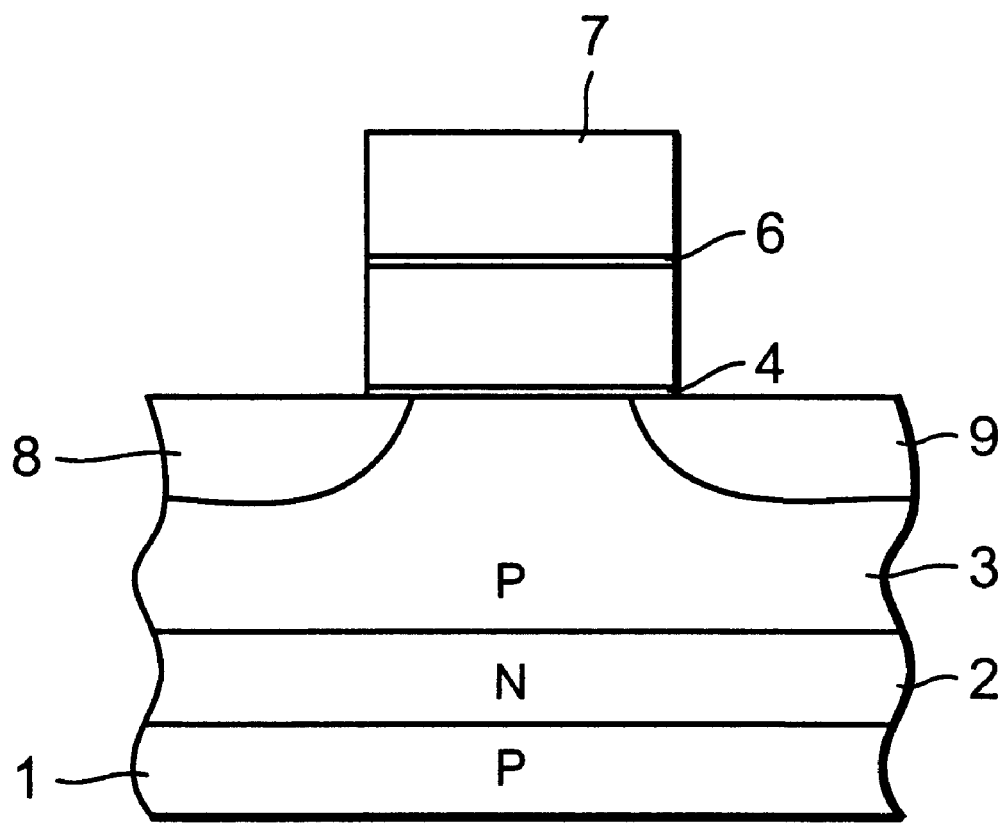
FIG. 1 is a diagram showing a structure of a semiconductor storage apparatus for use in the present invention.

Embodiments of the present invention will be described hereinafter with reference to the drawings.

FIG. 1 is a sectional view schematically showing a structure of a general semiconductor storage apparatus for use in the present invention. Moreover, FIG. 2 is an explanatory view of a writing/erasing/write-back operation of the semiconductor storage apparatus according to a first embodiment.

As shown in FIG. 1, for the semiconductor storage apparatus, an N well 2 is formed on a P-type silicon substrate 1, and a P well 3 is formed on the P-type silicon substrate 1 in the N well 2. In the P well 3, a source diffusion layer 8 and a drain diffusion layer 9 are formed of N-type impurity diffusion layers, and a floating gate 5 is formed of a polycrystalline silicon film with a thickness of the order of 100 to 200 nm via a thin gate insulating film 4 with a thickness of about 10 nm on the P well 3 between the source diffusion layer 8 and drain diffusion layer 9.

On the floating gate 5, a control gate 7 is formed via a poly inter insulating film 6 constituted of a thermal oxide film with a film thickness of the order of 10 to 25 nm, or of a lamination structure of an oxide film/nitride film/oxide film.

The writing/erasing/write-back operation in the semiconductor storage apparatus provided with this structure will be described with reference to FIG. 2. FIG. 2 shows voltages to be applied to a drain wiring, gate wiring, source wiring and P well substrate in the writing/erasing/write-back operation.

As shown in FIG. 2, the data writing/erasing operation with respect to a memory cell is performed similarly as the related art. Specifically, during writing, a voltage of about 5 V is applied to a bit line (selected bit line) connected to the drain diffusion layer 9 of a selected cell, and a voltage of about 10 V is applied to a word line (selected word line) connected to the control gate 7 of the selected cell.

Moreover, by setting a common source line and substrate (P well 3 here) connected to the source diffusion layer 8 to GND, and injecting a hot electron generated in a channel area formed between the source diffusion layer 8 and the drain diffusion layer 9, particularly in the channel area in the vicinity of the drain diffusion layer 9 to the floating gate 5 by a channel hot electron system, data writing is selectively performed.

Furthermore, with respect to erasing, by applying a voltage of about 5 V to the P well 3, and applying a negative high voltage of about −10 V to all word lines (control gate 7), the electron accumulated in the floating gate 5 of all memory cells in the P well 3 is collectively discharged to the substrate (P well 3) through the thin gate insulating film 4 under the floating gate 5 by an FN tunneling phenomenon.

In this state, since a large number of excessively erased cells exist in a memory cell array, compaction (write-back operation) needs to be performed. The write-back operation is performed by first applying a voltage of about 5 V to the common source line connected to the source diffusion layer 8 and applying a voltage of about 5 V to the selected word line of the control gate 7 connected to the excessively erased cell.

Moreover, by setting the substrate (or the P well 3) to a GND level, and setting the selected bit line connected to the drain diffusion layer 9 of the cell in which excess erasing exists to the GND level, and applying a voltage of about 5 V to other non-selected bit lines, the write-back operation is selectively performed on the excessively erased cell.

In the aforementioned storage method of the semiconductor storage apparatus, since the electron is injected to the floating gate 5 from the vicinity of the drain diffusion layer 9 during writing, and the electron is injected to the floating gate 5 from the vicinity of the source diffusion layer 8 during write-back after the erasing, a stress applied to the gate insulating film 4 under the floating gate 5 can be dispersed, the gate insulating film 4 in the repeating operation is inhibited from being deteriorated, and reliability can be enhanced.

The semiconductor storage apparatus and storage method according to a second embodiment of the present invention will next be described with reference to FIG. 3. FIG. 3 shows the voltages to be applied to the drain wiring, gate wiring, source wiring and P well substrate in the writing/erasing/write-back operation.

As shown in FIG. 3, the data writing/erasing operation to the memory cell is performed similarly as the first embodiment. Specifically, during writing, by applying a voltage of about 5 V to the selected bit line, applying a voltage of about 10 V to the selected word line, connecting the common source line and P well 3 to GND, and injecting the hot electron to the floating gate 5, data writing is selectively performed. Moreover, erasing is performed by applying a voltage of about 5 V to the P well 3, applying a negative high voltage of about −10 V to the control gate 7, and collectively discharging the electron accumulated in the floating gate 5 to the P well 3 by the FN tunneling phenomenon.

The compaction operation is characterized in that the write-back operation is selectively performed by a word line unit without selecting the bit line. Specifically, the operation is performed by applying a voltage of about 5 V to the common source line connected to the source diffusion layer 8 and applying a voltage of about 5 V to the selected word line of the control gate 7 connected to the excessively erased cell. Moreover, by setting the substrate (or the P well 3) to the GND level, and setting all digit lines connected to the drain diffusion layer 9 to the GND level, write-back of the excessively erased cell is performed.

In this case, it is expected that a probability of the excessively erased cell present on the same word line as that of the excessively erased cell is small, and there is substantially no increase of a current during write-back. Moreover, by performing the write-back operation by the word line unit, a write-back operation time can largely be reduced.

The semiconductor storage apparatus and storage method according to a third embodiment of the present invention will next be described with reference to FIG. 4. FIG. 4 shows the voltages to be applied to the drain wiring, gate wiring, source wiring and P well substrate in the writing/erasing/write-back operation of the semiconductor storage apparatus according to the third embodiment. Additionally, the present embodiment is different from the aforementioned first embodiment only in the write-back operation, and the writing/erasing operation is similar to that of the first embodiment.

As shown in FIG. 4, in the storage method of the present embodiment, the compaction operation is characterized in that the write-back operation is performed by a unit of the common source line connected to the source diffusion layer 8 (unit of a sector) without selecting the digit line/word line.

Specifically, the operation is performed by applying a voltage of about 5 V to the common source line connected to the source diffusion layer 8 and applying a voltage of about 5 V to all word lines in the sector (P well 3). Moreover, by setting the substrate (or the P well 3) to the GND level, and setting all digit lines connected to the drain diffusion layer 9 to the GND level, the write-back of all the excessively erased cells in the sector is performed.

In this case, since a compaction operation time can considerably be reduced, an erasing time can considerably be reduced, that is, performance of the semiconductor storage apparatus can be enhanced.

As described above, according to the semiconductor storage apparatus and storage method of the present invention, the deterioration of the gate oxide film by repeating the data writing/erasing/write-back operation can be inhibited, and enhancement of device reliability can effectively be achieved.

This is because in the storage method of the present invention, by performing the write-back operation on the source/drain which is different from that during write-in, the stress of the thin gate oxide film under the floating gate during repeating of the write-in/write-back operation can be dispersed.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A storage method of a semiconductor storage apparatus provided with a source/drain area formed in a semiconductor substrate, a floating gate formed on a top layer of the source/drain area via a gate insulating film, and a control gate formed on said floating gate via an interlayer insulating film, the method comprising steps of:

applying a predetermined positive voltage to a bit line connected to said drain area and a word line connected to said control gate, injecting an electron to said floating gate, and writing data to a selected memory cell;

applying a predetermined negative voltage to a gate line, applying the predetermined positive voltage to a common source line connected to said semiconductor substrate or said source area, discharging the electron accumulated in said floating gate of said selected memory cell, and performing data erasing; and after the data erasing, applying the predetermined positive voltage necessary for injecting the electron to said floating gate from a channel area in the vicinity of said source area to said common source line, and performing write-back of said memory cell erased excessively.

2. The storage method of the semiconductor storage apparatus according to claim 1, further comprising steps of:

during said write-back, applying the predetermined positive voltage to a selected word line connected to the memory cell in an excessively erased state, and grounding said semiconductor substrate and a selected bit line connected to said drain area of the memory cell in said excessively erased state; and applying the predetermined positive voltage to a non-selected bit line connected to said drain area of the memory cell not placed in the excessively erased state, and selecting and writing back the memory cell in said excessively erased state.

3. The storage method of the semiconductor storage apparatus according to claim 1, further comprising steps of: during said write-back, applying the predetermined positive voltage to the selected word line connected to the memory cell in the excessively erased state, grounding said semiconductor substrate and all said bit lines, and performing the write-back by a unit of said selected word line.

4. The storage method of the semiconductor storage apparatus according to claim 1, further comprising steps of: during said write-back, applying the predetermined positive voltage to all the word lines, grounding said semiconductor substrate and all the bit lines, and collectively writing back all the memory cells.

* * * * *